United States Patent [19]

Ishida et al.

[11] Patent Number: 5,553,257

[45] Date of Patent: Sep. 3, 1996

[54] ADDRESS GENERATING CIRCUIT OF A TWO-DIMENSIONAL CODING TABLE

[75] Inventors: Hideo Ishida; Yasushi Ooi, both of Tokyo, Japan

[73] Assignee: NEC Corporation, Tokyo, Japan

[21] Appl. No.: 189,680

[22] Filed: Feb. 1, 1994

[30] Foreign Application Priority Data

Feb. 3, 1993 [JP] Japan .................................. 5-016013

[51] Int. Cl.⁶ .................................................. G06F 12/00
[52] U.S. Cl. .......................... 395/401; 395/114; 395/888
[58] Field of Search .................................. 395/200, 400, 395/425, 144, 188; 358/448; 341/50, 67; 369/30; 382/56

[56] References Cited

U.S. PATENT DOCUMENTS

| | | | |
|---|---|---|---|
| 4,545,032 | 10/1995 | Mak | 364/900 |
| 5,280,361 | 1/1994 | Ishikawa | 358/261.1 |
| 5,296,938 | 3/1994 | Nakayama | 358/448 |

*Primary Examiner*—Jack A. Lane
*Assistant Examiner*—Fadi Stephan
*Attorney, Agent, or Firm*—Whitham, Curtis, Whitham & McGinn

[57] ABSTRACT

An address generating circuit having a two-dimensional coding table which has respective coded words corresponding to a combination of x and y where the value of event A is determined as x and the value of event B as y (x and y are positive integers) between two events A and B, and stores the coded words in an address corresponding to each combination of x and y; coincidence detectors which input the values x and y of the events A and B and detect whether these values coincide with the integer of 1 to S (S is the maximum number among the integers satisfying $S+\log_2 S<P$ and P is a positive integer); comparators which examine whether the inputted y satisfies $x+\log_2 y \leq P$ for each integral number of x, and examine whether the inputted x satisfies $y+\log_2 x \leq P$ for each integral number of y; an escape signal generation section which outputs an escape signal according to the output of the coincidence detectors and the comparators; an address generation section which generates and outputs an address signal from values x and y and an identification address for identifying that x and y are integers; a priority control section which inputs the output from the coincidence detectors, determines which signal is outputted with precedence and outputs it; and a multiplexer which selects and outputs an address signal in accordance with the output from the priority control section.

12 Claims, 6 Drawing Sheets

ADDRESS GENERATING CIRCUIT OF A TWO-DIMENSIONAL CODING TABLE

BACKGROUNDS OF THE INVENTION

1. Field of the Invention

This invention relates to an address generating circuit of a two-dimensional coding table, and particularly to an address generating circuit of a two-dimensional coding table where coded words are distributed in certain ranges of two events.

2. Description of the Related Art

For coding of time series signals having deviated generating frequency, unequal length codes which give a short code to a signal having a high occurrence frequency and a long code to a signal having a low occurrence frequency are used to allow compression coding. This coding is called an entropy coding (Huffman code is one type of the entropy coding). The entropy coding has been applied in various fields such as coding of voice signals and image signals.

In variable length coding and variable length decoding, the average code length can be minimized by coding to a bit length corresponding to a log (2 is the bottom) with respect to a reciprocal number of the appearance frequency of each code.

In particular, when the data occurrence probability is heavily deviated in making transmission or large accumulation of data, the entropy coding is effective for data compression. For example, in the case of recording daily wind direction for past 100 years, to record in a district having frequent northerly winds, it is advantageous to compress data when the wind directions and the coded words are corresponded as 1=north, 01=northeast, 001=south, 0001=west, etc. And in recording in a district having frequent westerly winds, data is advantageously compressed by assigning a short code to west. Similarly, in the case of recording daily wind velocity for past 100 years, it is possible to assign, for example, 1=10 m/sec, 01=30 m/sec, 001=5 m/sec, 0001=20 m/sec, etc. in order from high to low relating to the data occurrence probability.

In the above coding example, one-dimensional parameters such as wind direction and wind velocity were coded. Further, coding having two parameters (two-dimensional coding) can also be considered. For example, to record both the wind direction and wind velocity, with the wind direction and wind velocity as parameters, a short code is assigned in order from high to low relating to the occurrence probability. In this case, the codes are assigned as 1=north wind 10 m/sec, 01=south wind 10 m/sec, 10=south wind 10 m/sec, 001=west wind 10 m/sec, etc.

Generally, for entropy coding, assignment of the entropy codes becomes complex as the assembly of codes becomes larger. In particular, in the two-dimensional coding, the assembly of codes becomes a direct product of two assemblies of codes. To apply to this case, an escape code may be used for codes having sufficiently low occurrence probability.

The escape code takes a form having values of two codes (binary fixed length code) coupled with escape identification section as the entropy code. This escape code is defined, the entropy code is assigned to a combination of high occurrence probability, and the escape code is assigned to a combination of sufficiently low occurrence probability, so that the size of a coding table for fixing the corresponding relation between data and codes is small.

An example of the escape code in recording the aforementioned wind direction and wind velocity will be described. For example, the wind direction is coded using 4-bit codes as follows 0000=north, 0001=south, 0010=east, 0011=west, 0100=northeast, 0101=northwest, and the wind velocity is coded using 6-bit codes as follows: m/sec, 000001=20 m/sec, 000010=30 m/sec, 000011=40 m/sec, . . . for every 10 m/sec. And, these two codes are coupled into 10-bit codes indicating the wind direction using the high order 4 bits and the wind velocity using the low order 6 bits. Thus, a state with low occurrence possibility can be coded.

The coding table determining the corresponding relation between recorded data and codes is generally structured by assigning respective coded words to each address on memory. Therefore, to refer to a coded word corresponding to a certain data, the assigned address has to be determined. Particularly, in the two-dimensional coding table, an address in that coding table has to be calculated from the values of two events. A conventional address generating circuit to generate the address of such a two-dimensional coding table is as follows.

A first address generating circuit is a circuit to read from a coding table a coded word corresponding to the values of two events according to a software program. This address generating circuit has a CPU for processing a program and an instruction memory to store the program as essential components. In this address generating circuit, an address is generated as follows. First, an appropriate address is assigned on memory to every coded word corresponding to data. The program detects the values of two events and outputs an address corresponding to their parameters. For example, when recording the aforementioned wind direction and wind velocity, among the two events, the wind direction is determined to be event A and the wind velocity as event B, and an address of a coded word for north wind 10 m/sec is to be read. In this case, when event A=0001, event B=000001, and an address having a coded word stored in the coded word table is determined to be 0010 address, it is programed to read the 0010 address by a condition judgment of (A=0001) and (B=000001). Using the circuit thus programed, a condition is judged from the values of events A and B with respect to every coded word to generate an address of the coding table.

A second address generating circuit is a circuit to output an address of the coding table using hardware means such as a comparator or detector in which the values of two events are entered. Specifically, this is a process to generate an address of the coded word through hardware by preparing a dedicated decoder.

A third address generating circuit is a circuit having a coding table having the values themselves of two events corresponded to a coded word as an address. This address generating circuit has the value of event A as a high order of the address and the value of event B as a low order of the address, and the values of A and B are coupled to generate an address of the coding table. Such an address generating circuit does not need the addition of a dedicated hardware, and an address can be generated simply.

But, the aforementioned conventional address generating circuit of two-dimensional coding table has the following drawbacks.

The first address generating circuit according to program successively compares the values of two events on a program to output an address and requires the time for comparison. Therefore, it cannot be used for a high-speed processing such as a real time image processing. And, it also needs a system for address generation such as a CPU and an instruction memory for storing the program. Thus, the construction is complicated.

The second address generating circuit for generating an address through hardware needs a dedicated hardware for detecting an address of the coding table corresponding to the values of two events, so that the circuit becomes large when the circuit needs to correspond to a large volume of coded words exceeding 100 words.

The third address generating circuit with the coding table having the values of two events as an address has the drawback that a memory capacity which is required by a memory for storing a coding table becomes large.

SUMMARY OF THE INVENTION

An object of this invention is to provide an address generating circuit of a two-dimensional coding table which operates fast, does not become large even when corresponding to a large volume of coded words, and does not need a large capacity memory to store a coding table.

The address generating circuit of the two-dimensional coding table for accomplishing the above object of this invention comprises:

- a two-dimensional coding table which has respective coded words corresponding to a combination of x and y where the value of event A is determined as x and the value of event B as y (x and y are positive integers) between two events A and B, and stores the coded words in an address corresponding each combination of x and y,
- a coincidence detection means which inputs the values x and y of the events A and B and detects whether these values coincide with the integers within the range of 1 to S (S is the maximum number among the integral numbers satisfying $S+\log_2 S < P$ and P is a positive integral number),
- a first comparing means which detects whether the inputted value y of the event B satisfies $x+\log_2 y \leq P$ with respect to the range of 1 to S of the value x of the event A,
- a second comparing means which detects whether the inputted value x of the event A satisfies $y+\log_2 x \leq P$ with respect to the range of 1 to S of the value y of the event B,
- an escape signal generating means which outputs an escape signal and supplies it to the two-dimensional coding table when the value x of the event A or the value y of the event B does not fall within the above range according to the detected result of the coincidence detection means, and when the value y of the event B does not satisfy $x+\log_2 y \leq P$ or the value x of the event A does not satisfy $y+\log_2 x \leq P$ according to the detected result of the first and second comparing means,
- an address generation means which generates and outputs an address signal from the values of the above x and y and an identification address for identifying which value of the integral numbers of the above range when at least one of the value x of the event A or the value y of the event B falls within the above range according to the detected result of the coincidence detection means, and
- a selection means which selects and outputs the address signal according to the output of the address generation means and supplies it to the two-dimensional coding table.

Other objects, features and effects of this invention will be more clearly understood from the following detailed description.

DESCRIPTION OF THE PREFERRED EMBODIMENT

Preferable embodiments of this invention will be described in detail with reference to the attached drawings.

Figure 1:
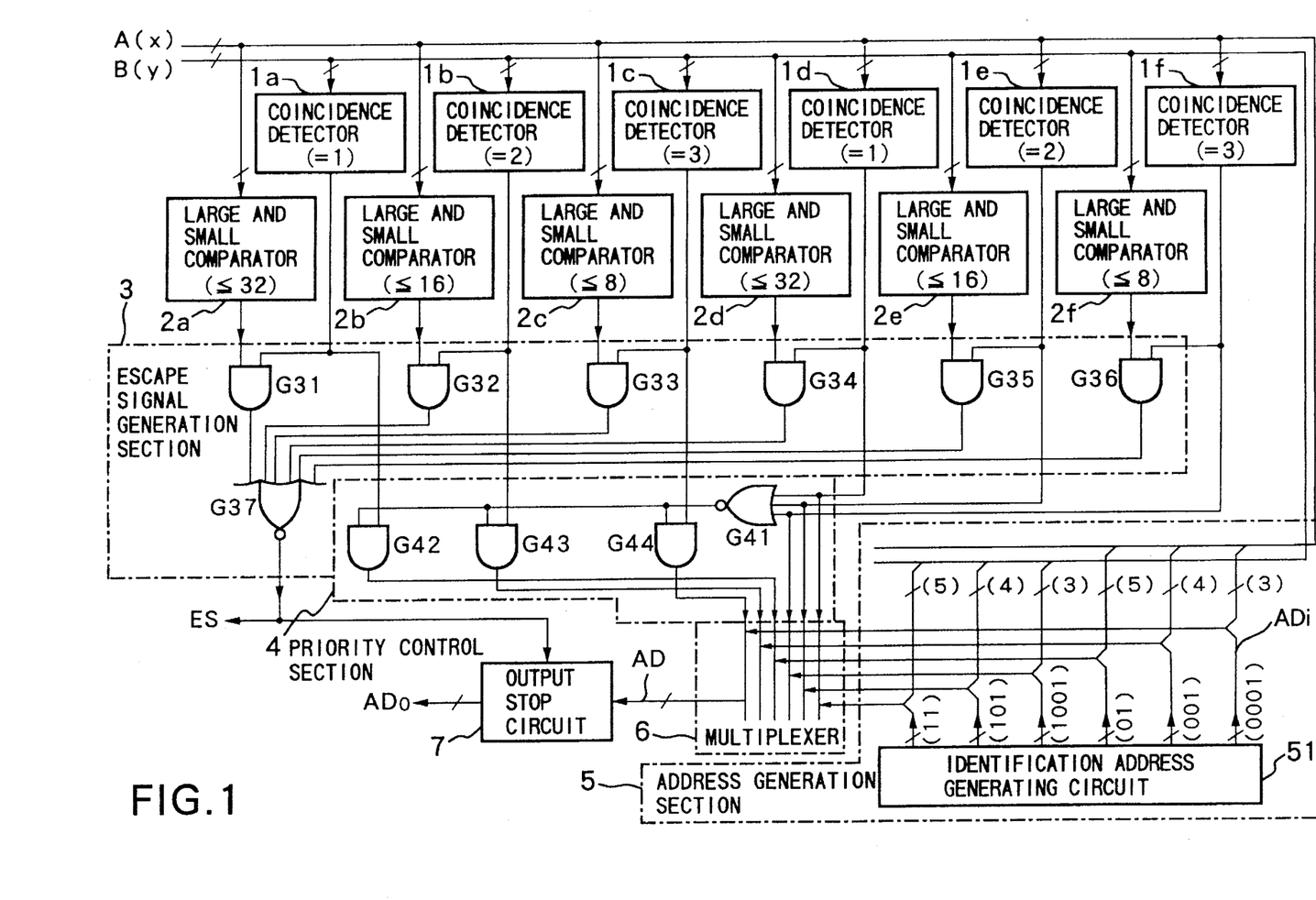
FIG. 1 is a circuit diagram showing the structure of the address generating circuit of two-dimensional coding table according to a first embodiment of this invention.
Figure 2:
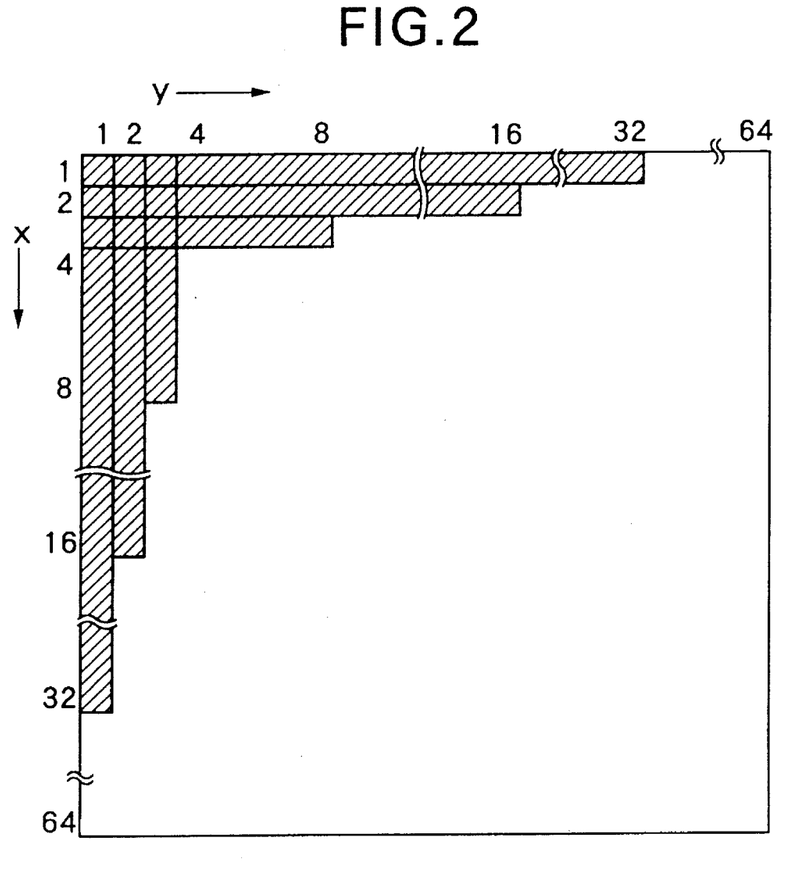
FIG. 2 is a state diagram showing the distributed condition of coded words of the two-dimensional coding table which is subjected to the treatment according to the embodiment of FIG. 1.

FIG. 1 is a circuit diagram showing the structure of the address generating circuit of a two-dimensional coding table according to a first embodiment of this invention. FIG. 2 is a state diagram showing the distributed condition of coded words of the two-dimensional coding table which is subjected to the address generating circuit of FIG. 1.

The address generating circuit of this embodiment is intended for a two-dimensional coding table which determines the value of event A as x and the value of event B as y (x and y are positive integers) between two events A and B, a respective coded word to a combination of x and y consisting of x which satisfies $x+\log_2 y \leq P$ with respect to each integer from 1 through S (S is the maximum value among integer meeting $S+\log_2 S < P$, and P is a positive integer) and y which satisfies $y+\log_2 x \leq P$ with respect to each integer of from 1 through S, and stores the applicable coded word in an address which is disposed to correspond to each combination of x and y. In other words, when the distributed condition of coded words corresponding to combinations of x and y is illustrated on an x-y plane with two axes x and y crossing at right angles, as shown in FIG. 2, the two events A and B which become a combination of x and y are subjected so that the distributed condition of coded words becomes linearly symmetus with respect to the straight lines of x=y.

This embodiment relates to an address generating circuit when P=6 and S=3 in the aforementioned formula $S+\log_2 S < P$.

Referring to the distributed condition of coded words shown in FIG. 2, it is seen that the value x of event A determines the number of bits in an effective range of the value y of event B, and the value y of event B determines the number of bits in an effective range of the value x of event A. For example, when x=2, the coded words are distributed in the range of y which is represented by 4 bits, and when x=3, the coded words are distributed in the range of y which is represented by 3 bits. Similarly, when y=1, the coded words are distributed in the range of x which is represented by 5 bits, when y=2, the coded words are distributed in the range of x which is represented by 4 bits, and when y=3, the coded words are distributed in the range of x which is represented by 3 bits. This is generally an area satisfying x+log$_2$y=P when x=1 to 3 and y+log$_2$x≦P (where P=6) when y=1 to 3. Areas other than this area are for escape codes. Taking this deviated distributed condition of coded words into consideration, an address is assigned to the coded words.

Among values x and y of events A and B, values x=3 and y=3 are the maximum values among integer satisfying S=log$_2$S<P where P=6.

The distributed condition of coded words described above is summarized as follows.

When x=1, y is 1 to 32, resulting in 32 words.

When x=2, y is 1 to 16, resulting in 16 words.

When x=3, y is 1 to 8, resulting in 8 words.

When y=1, x is 1 to 32, resulting in 32 words.

When y=2, x is 1 to 16, resulting in 16 words.

When y=3, x is 1 to 8, resulting in 8 words.

To indicate the addresses corresponding to all coded words in such a distributed condition with respect to the combinations of x and y in the aforementioned ranges, 1+log$_2$32 bits are required for x=1 to 3, and 1+log$_2$32 bits are required for y=1 to 3, so that 2+log$_2$32 bits, or P+1 =6, are required for all x and y.

This embodiment shown in FIG. 1 comprises a plurality of coincidence detectors 1a to 1f which input values x and y of events A and B and detect whether the input values coincide with integers 1 to 3, large and small comparators 2a to 2c which detect whether the inputted y satisfies x+log$_2$y≦6 for each integer from 1 to 3 of x, large and small comparators 2d to 2f which detect whether the inputted x satisfies y+log$_2$x≦6 for each integer of from 1 to 3 of y, an escape signal generation section 3 which outputs an escape signal according to the output of the coincidence detectors 1a to 1f and the large and small comparators 2a to 2f, an address generation section 5 which generates and outputs an address signal from values x and y and an identification address ADi for identifying that x and y are integers from 1 to 3, a priority control section 4 which inputs the output from the coincidence detectors 1a to 1f, determines which signal is outputted with precedence and outputs it, a multiplexer 6 which selects and outputs an address signal in accordance with the output from the priority control section 4, and an output stop circuit 7 which stops the supply of a two-dimensional coding table of the output signal from the multiplexer 6 according to the escape signal.

The coincidence detectors 1a to 1f consist of the coincidence detectors 1a to 1c for inputting y and the coincidence detectors 1d to 1f for inputting x. And, they detect whether the inputted x and y coincide with integral numbers 1 to 3, the coincidence detectors 1a and 1d output a coincidence detection signal which becomes an active level when y is 1, the coincidence detectors 1b and 1e output a coincidence detection signal which becomes an active level when y is 2, and the coincidence detectors 1c and 1f output a coincidence detection signal which becomes an active level when y is 3.

The large and small comparators 2a to 2c inspect whether the inputted y satisfies x+log$_2$y≦6 with respect to x, the large and small comparator 2a outputs a compared result signal which becomes an active level when x=1 and y≦32, the large and small comparator 2b outputs a compared result signal which becomes an active level when x=2 and y≦16, and the large and small comparator 2c outputs a compared result signal which becomes an active level when x=3 and y≦8. The large and small comparators 2d to 2f inspect whether the inputted x satisfies y+log$_2$x≦6 with respect to y, the large and small comparator 2d outputs a compared result signal which becomes an active level when y=1 and x≦32, the large and small comparator 2e outputs a compared result signal which becomes an active level when y=2 and x≦16, and the large and small comparator 2f outputs a compared result signal which becomes an active level when y =3 and x≦8.

The escape signal generation section 3 has AND type logic gates G31 to G36 and NOR type logic gate G37. The logic gates G31 to G36 input one detection signal from the coincidence detectors 1a to 1f and a compared result signal from the large and small comparators 2a to 2f, and the logic gate G37 inputs an output signal from the logic gates G31 to G36. And, when there is no combination at an active level among combinations of coincidence detection signals and compared result signals corresponding thereto, escape signal ES at an active level is outputted. Thus, when x is 1, 2 or 3 and y does not satisfy x+log$_2$y≦6, and y is 1, 2 or 3 and x does not satisfy y+log$_2$x≦6, a coded word corresponding to a combination of x and y containing the above x and y is processed as an escape code.

The address generation section 5 has an identification address generating circuit 51 which generates an identification address ADi for identifying that x and y are integers from 1 to 3, couples each identification address ADi of y with a certain bit at lower order of the inputted x to output respectively as an address signal AD of 7 bits.

Figure 3:
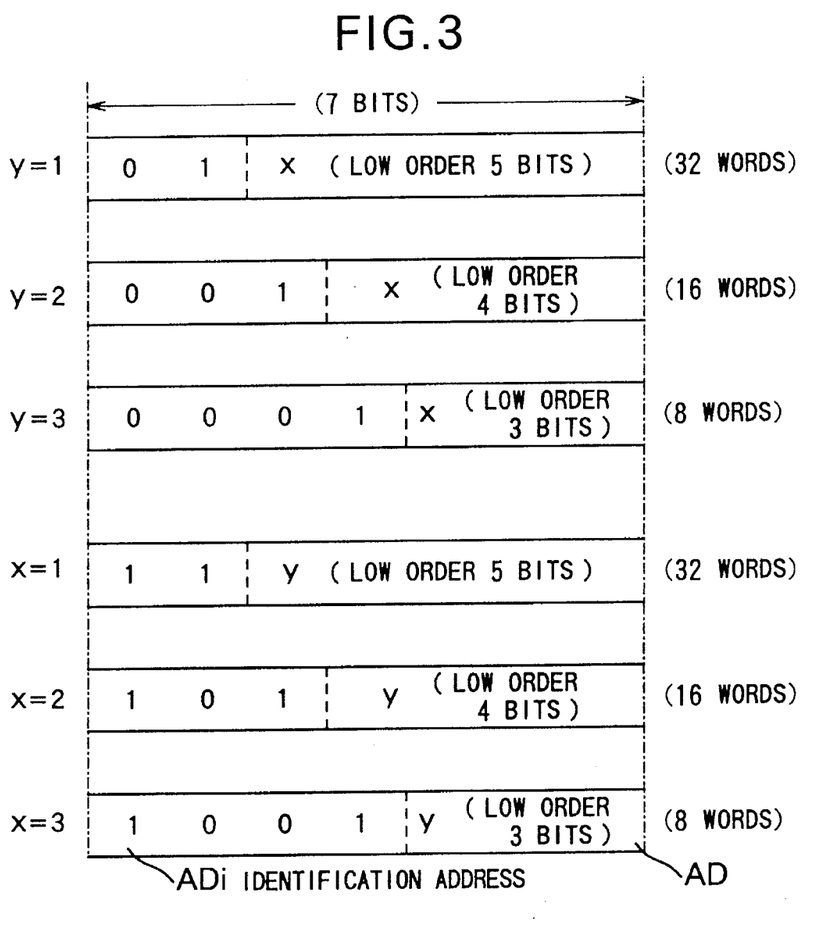
FIG. 3 is a chart showing the data format of the outputted address signals of the embodiment of FIG. 1.

The identification address ADi consists of the most significant bit indicating a difference between x side and y side (for example, x side is indicated by 1 and y side by 0) and 1 to 3 bits (for example, 1=1, 2=01, 3=001, etc.) indicating 1, 2, 3 succeeding thereto. And, since it is sufficient if a certain bit at lower order of y and x corresponding to the identification address ADi can identify 32 words when x and y are 1, 16 words when x and y are 2, and 8 words when x and y are 3, respective bits at lower order of y and x forming the address signal AD become 5 bits, 4 bits, and 3 bits. FIG. 3 shows the data format of the address AD thus generated.

The priority control section 4 has NOR type logic gate G41 and AND type logic gates G42 to G44. The logic gate G41 inputs a coincidence detection signal from the coincidence detectors 1d to 1f, and the logic gates G42 to G44 input the coincidence detection signals from the coincidence detectors 1a to 1c and the output from the logic gate G41. And, when both the coincidence detection signals on x side and the coincidence detection signals on y side include signals at an active level, the coincidence detection signal on y side is masked, and the coincidence detection signal on x side only is only output with precedence. In other cases, both the coincidence detection signal on x side and the coincidence detection signal on y side are outputted as they are. Thus, even when there are signals at an active level in both the coincidence detection signals on x side and the coincidence detection signals on y side, a possibility that one address signal AD cannot be surely selected can be avoided.

The multiplexer 6 selects and outputs the address signal AD containing an identification address ADi corresponding to the applicable x or y among the address signal AD which is outputted from the address generation section 5, according to the coincidence detection signal at an active level of the coincidence detectors 1a to 1f.

As described above, in this embodiment, since the coincidence detectors, large and small comparators and others are sufficient by being provided in numbers corresponding to the maximum number of integer S satisfying S+$\log_2$S <P, the circuit scale can be made small. And, the memory capacity of the memory for the two-dimensional coding table is also sufficient in the numbers for addresses corresponding to P+1 bit. Further, since processing is directly made through hardware, high-speed processing in real time is possible.

Figure 4:
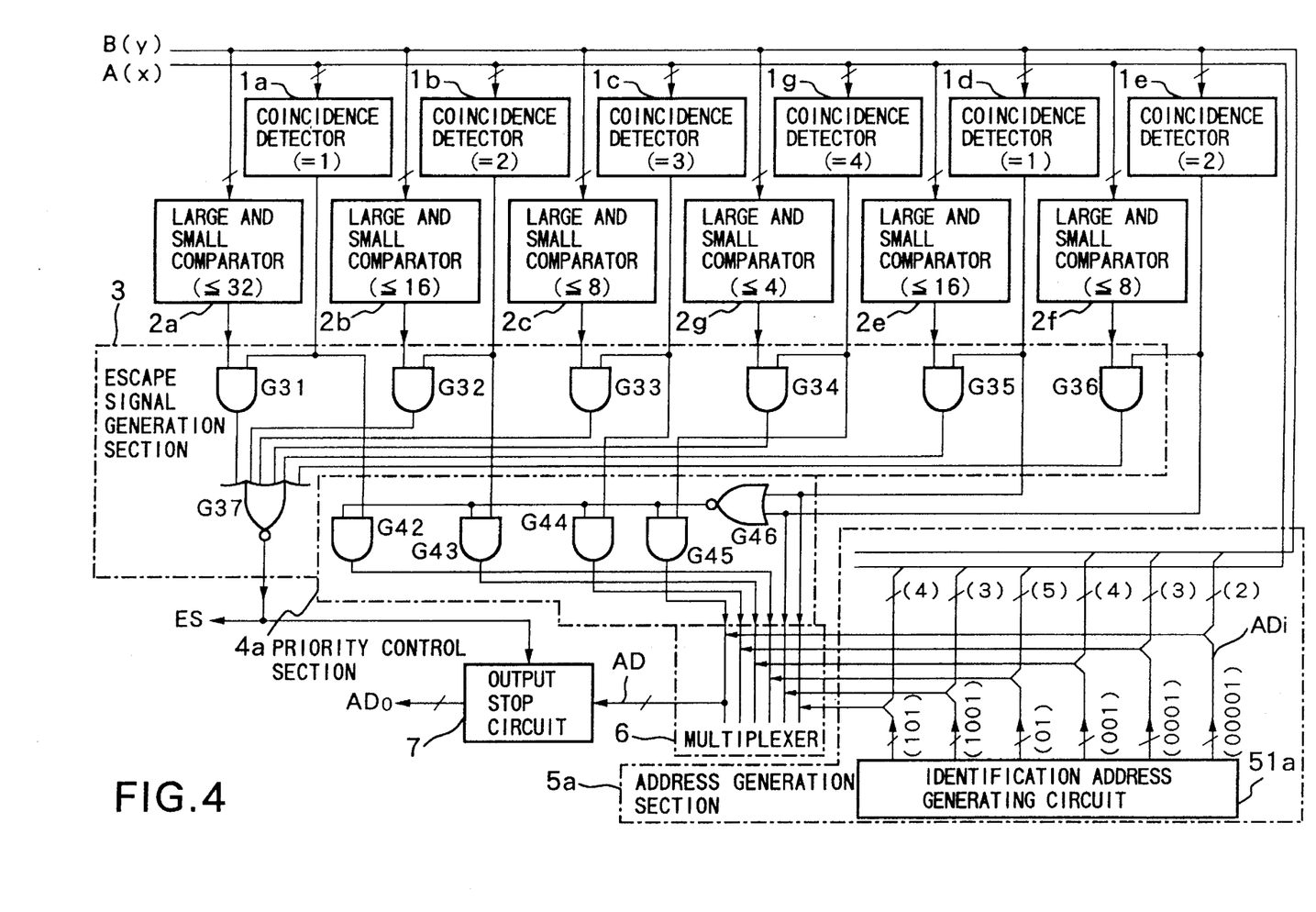
FIG. 4 is a circuit diagram showing the structure of the address generating circuit of two-dimensional coding table according to a second embodiment of this invention.
Figure 5:
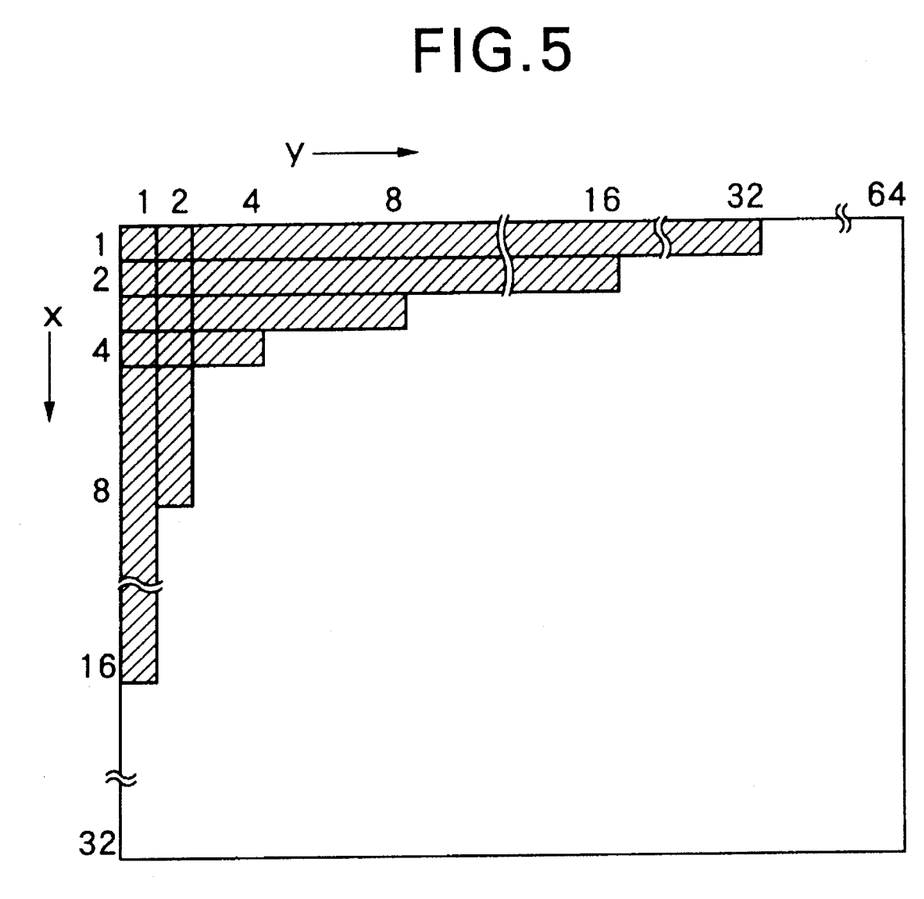
FIG. 5 is a state diagram showing the distributed condition of coded words of the two-dimensional coding table which is subjected to the treatment according to the embodiment of FIG. 4.
Figure 6:
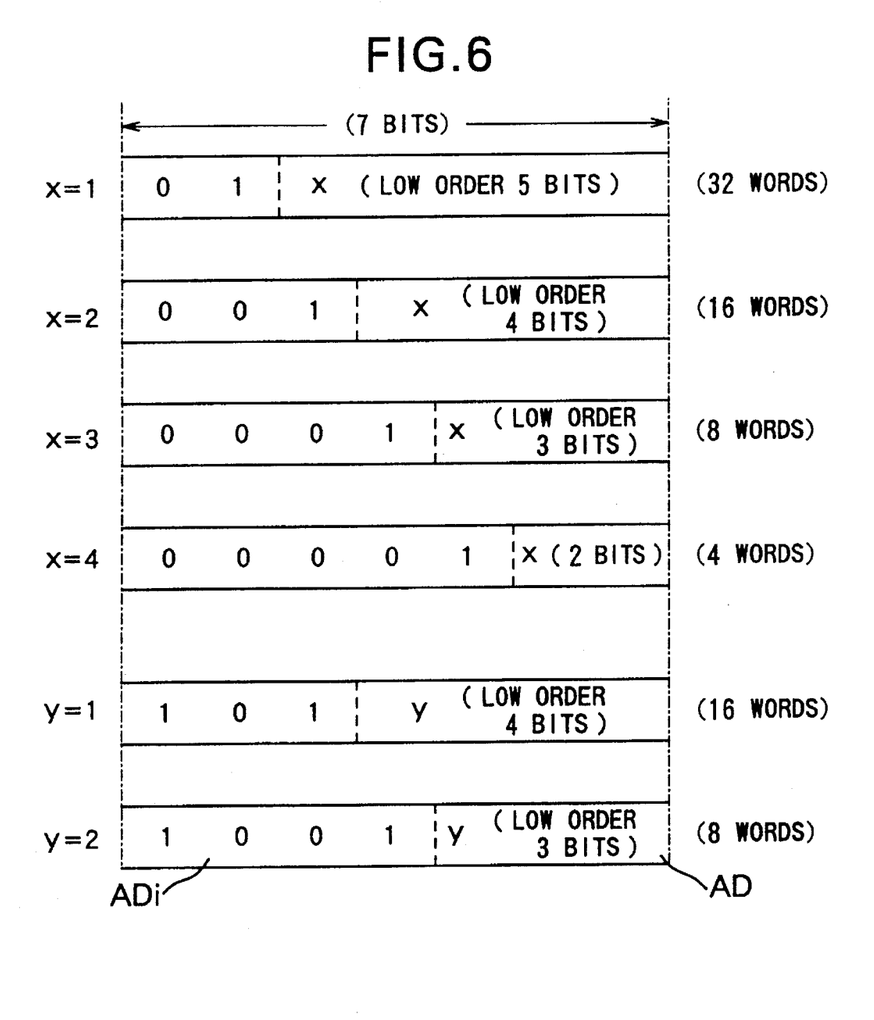
FIG. 6 is a chart showing the data format of the outputted address signals of the embodiment of FIG. 4.

FIG. 4 is a circuit diagram showing the structure of the address generating circuit of two-dimensional coding table according to a second embodiment of this invention. FIG. 5 is a state diagram showing the distributed condition of coded words of the two-dimensional coding table which is subjected to the address generating circuit of FIG. 4.

The address generating circuit of this embodiment is intended for a two-dimensional coding table which determines the value of event A as x and the value of event B as y (x and y are positive integers) between two events A and B, corresponds a respective coded word to a combination of x and y consisting of x which satisfies x+$\log_2$y≦P with respect to each integer from 1 through S (S is the maximum value among integer satisfying $2^{(P-S)}$–1≦Q –$\log_2$S, and P and Q are positive integer) and y which satisfies y+$\log_2$x≦Q with respect to each integer from 1 through R (R is the maximum value among integers satisfying $2^{(Q-R)}$–1≦P– $\log_2$R), and stores the applicable coded word in an address which is disposed to correspond to each combination of x and y. In other words, when the distributed condition of coded words corresponding to combinations of x and y is illustrated on an x-y plane with two axes x and y crossing at right angles, as shown in FIG. 5, the two events A and B which become a combination of x and y are subjected so that the distributed condition of coded words does not become linearly symmetric with respect to the straight lines of x=y.

This embodiment relates to an address generating circuit when P=6, Q=5, R=2 and S=4 in the aforementioned formulas $2^{(P-S)}$–1≧Q–$\log_2$S and $2^{(Q-R)}$–1≧P–$\log_2$R.

Referring to the distributed condition of coded words shown in FIG. 5, when x=1, the coded words are distributed in the range of y which is represented by 5 bits, when x=2, the coded words are distributed in the range of y which is represented by 4 bits, when x=3, the coded words are distributed in the range of y which is represented by 3 bits, and when x=4, the coded words are distributed in the range of y which is represented by 2 bits. Similarly, when y=1, the coded words are distributed in the range of x which is represented by 4 bits, and when y=2, the coded words are distributed in the range of x which is represented by 3 bits. This is generally an area satisfying x+$\log_2$y≦6 when x=1 to 4 and y+$\log_2$x≦5 when y=1 to 2.

Among values x of event A, value x=4 is the maximum values among integer satisfying $2^{(6-S)}$–1≧5–$\log_2$S. And among values y of event B, value y=2 is the maximum values among integer satisfying $2^{(5-R)}$–1≧6–$\log_2$R.

Areas other than the above that become areas of the escape code are the same with that of the first embodiment shown in FIG. 1 and FIG. 2.

The distributed condition of coded words described above is summarized as follows.

When x=1, y is 1 to 32, resulting in 32 words.
When x=2, y is 1 to 16, resulting in 16 words.
When x=3, y ms 1 to 8, resulting in 8 words.
When x=4, x is 1 to 4, resulting in 4 words.
When y=1, x ms 1 to 32, resulting in 32 words.
When y=2, x is 1 to 16, resulting in 16 words.

To indicate the addresses corresponding to all coded words in such a distributed condition with respect to the combinations of x and y in the aforementioned ranges, a larger value of P or Q, or P+1=7 bits are required in the above example.

This embodiment shown in FIG. 4 comprises a plurality of coincidence detectors 1a to 1e and 1g which input values x and y of events A and B and detect whether the inputted values coincide with integer 1 to 3, large and small comparators 2a to 2c and 2g which detect whether the inputted y satisfies x+$\log_2$y≦6 for each integer from 1 to 3 of x, large and small comparators 2e to 2f which detect whether the inputted x satisfies y+$\log_2$x≦6 for each integer from 1 to 3 of y, an escape signal generation section 3 which outputs an escape signal according to the output of the coincidence detectors 1a to 1f and the large and small comparators 2a to 2f, an address generation section 5 which generates and outputs an address signal from values x and y and an identification address ADi for identifying that x and y are which of integer of 1 to 3, a priority control section 4 which inputs the output from the coincidence detectors 1a to 1f, determines which signal is outputted with precedence and outputs it, a multiplexer 6 which selects and outputs an address signal in accordance with the output from the priority control section 4, and an output stop circuit 7 which stops the supply of a two-dimensional coding table of the output signal from the multiplexer 6 according to the escape signal.

This embodiment is slightly different from the first embodiment in the circuit structure, the contents of the address signal AD and others. But such differences are not essential, and the basic operation and effects are same with the first embodiment. More specifically, the coincidence detectors, large and small comparators and others are sufficient in the number corresponding to the number added with the maximum number of integer S satisfying $2^{(P-S)}$– 1≧Q–$\log_2$S and the maximum number of integer R satisfying $2^{(Q-R)}$–1≧P–$\log_2$R, so that the circuit scale can be made small. And, the memory capacity of the memory for the two-dimensional coding table is also sufficient in the numbers for addresses corresponding to a larger number of P or Q+1 bits. Further, since processing is directly made through hardware, high-speed processing in real time is possible.

As described above with reference to the preferable embodiments, this invention is provided with needed and sufficient number of coincidence detectors and comparators derived according to the contributed state of codes and a means for generating an address signal with needed and sufficient address numbers similarly derived, and has the structure to select the address signal according to the output signal of the above coincidence detectors and to generate the escape signal according to the output signal of the above coincidence detectors and comparators, so that it has an effect that the memory capacity of the two-dimensional coding table and the circuit scale can be made small. This invention also has an effect of making a high-speed processing in real time since the processing can be directly made through hardware.

Obviously, various modifications can be made to the above embodiments. It is intended to cover in the appended claims all such modifications and variations as fall within the true spirit and scope of the present invention.

What is claimed is:

1. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means for inputting the values x and y of the events A and B and detecting whether said values x and y coincide with numbers in an integer range of 1 to S (wherein S is the maximum number among the integers satisfying $S+\log_2 S < P$ and P is a positive integer);

first comparing means for detecting whether the inputted value y of the event B satisfies $x+\log_2 y \leq P$ with respect to the integer range of 1 to S of the value x of the event A;

second comparing means for detecting whether the inputted value x of the event A satisfies $y+\log_2 x \leq P$ with respect to the integer range of 1 to S of the value y of the event B;

escape signal generating means for outputting an escape signal and supplying said escape signal to the two-dimensional coding table when the value x of the event A or the value y of the event B does not fall within said integer range of 1 to S according to a detected result of the coincidence detection means, and when the value y of the event B does not satisfy $x+\log_2 y \leq P$ or the value x of the event A does not satisfy $y+\log_2 x \leq P$ according to a detected result of the first and second comparing means;

address generation means for generating and outputting an address signal from the values of said x and y and an identification address for identifying a value within said integer range when at least one of the value x of the event A or the value y of the event B falls within said integer range according to the detected result of the coincidence detection means; and selection means for selecting and outputting the address signal according to the output of the address generation means and supplying said address signal to the two-dimensional coding table.

2. An address generating circuit of a two-dimensional coding table according to claim 1 further comprising priority control means for selecting and outputting to said two-dimensional coding table either the coincidence detection signal of the value x or the coincidence detection signal of the value y when both the value x of the event A and the value y of the event B fall within the integer range of 1 to S as detected by the coincidence detection means.

3. An address generating circuit of a two-dimensional coding table according to claim 2, wherein the coincidence detection means has S number of coincidence detectors for inputting the value x of the event A and S number of coincidence detectors for inputting the value y of the event B, said coincidence detectors outputting a coincidence detection signal having an active level when the inputted value x of the event A or the value y of the event B falls within the integer range of 1 to S, the first comparing means having S numbers of comparators for inputting the value y of the event B, said comparators outputting a comparison result signal having said active level when the inputted value y of the event B satisfies $x+\log_2 y \leq P$ corresponding to each number within said integer range of 1 to S of x, the second comparing means having S number of comparators for inputting the value x of the event A, said comparators outputting a comparison result signal having said active level when the inputted value x of the event A satisfies $y+\log_2 x \leq P$ corresponding to each number within said integer range of 1 to S of y, the escape signal generating means comprising a plurality of logic gates for inputting said coincidence detection signal from the coincidence detectors and the comparison result signal from the first and second comparators and outputting an escape signal having said active level when neither of the coincidence detection signal and the comparison result signal corresponding thereto have said active level, the address generation means having an identification address generating circuit for generating the identification address, associating each identification address of the value x of the event A with the inputted value y of the event B and associating each identification address of the value y of the event B with the bit of the inputted value x of the event A to output an address signal of P+1 bits, the priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases, and the selection means for selecting and outputting the address signal containing the identification address corresponding to the applicable value x of the event A or the value y of the event B among the address signals outputted from the address generation means according to the coincidence detection signal having an active level as detected by the coincidence detectors.

4. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means for inputting the values x and y of the events A and B and detecting whether said values x and y coincide with numbers in an integer range of 1 to S (wherein S is the maximum number among the integers satisfying $S+\log_2 S < P$ and P is a positive integer);

first comparing means for detecting whether the inputted value y of the event B satisfies $x+\log_2 y \leq P$ with respect to the integer range of 1 to S of the value x of the event A;

second comparing means for detecting whether the inputted value x of the event A satisfies $y+\log_2 x \leq P$ with respect to the integer range of 1 to S of the value y of the event B;

escape signal generating means for outputting an escape signal and supplying said escape signal to the two-dimensional coding table when the value x of the event A or the value y of the event B does not fall within said integer range of 1 to S according to a detected result of the coincidence detection means, and when the value y of the event B does not satisfy $x+\log_2 y \leq P$ or the value x of the event A does not satisfy $y+\log_2 x \leq P$ according to a detected result of the first and second comparing means;

address generation means for generating and outputting an address signal from the values of said x and y and an identification address for identifying a value within said integer range when at least one of the value x of the event A or the value y of the event B falls within said integer range according to the detected result of the coincidence detection means;

selection means for selecting and outputting the address signal according to the output of the address generation means and supplying said address signal to the two-dimensional coding table;

priority control means for selecting and outputting to said two-dimensional coding table either the coincidence detection signal of the value x or the coincidence detection signal of the value y when both the value x of the event A and the value y of the event B fall within the integer range of 1 to S as detected by the coincidence detection means; and an output stop circuit stopping supply of the output signal of the selection means to the two-dimensional coding table upon receipt of the escape signal outputted from the escape signal generating means.

5. An address generating circuit of two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means having S number (wherein S is the maximum number among the integers satisfying $S+\log_2 S < P$ and P is a positive integer) of coincidence detectors for inputting value x of event A and S number of coincidence detectors for inputting value y of event B, said coincidence detectors outputting a coincidence detection signal having an active level when the inputted value x of the event A or the value y of the event B corresponds to the numbers within the integer range of 1 to S;

first comparing means having S number of comparators for inputting the value y of the event B, said comparators outputting a comparison result signal having an active level when the inputted value y of the event B satisfies $x+\log_2 y \leq P$ corresponding to each number within said integer range of 1 to S of x;

second comparing means having S number of comparators for inputting the value x or the event A, said comparators outputting a comparison result signal having an active level when the inputted value x of the event A satisfies $y+\log_2 x \leq P$ corresponding to each number within said integer range of 1 to S of y;

escape signal generating means comprising a plurality of logic gates for inputing said coincidence detection signal from the coincidence detectors and the comparison result signal from the first and second comparators and outputting an escape signal having said active level when neither of the coincidence detection signal and the comparison result signal corresponding thereto having said active level;

address generation means having an identification address generating circuit tier generating the identification address, associating each identification address of the value x of the event A with the inputted value y and associating each identification address of the value y of the event B with the bit of the inputted value x to output an address signal of P+1 bits;

priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases; and selection means for selecting and outputting the address signal containing the identification address corresponding to the applicable value x of the event A or the value y of the event B among the address signals outputted from the address generation means according to the coincidence detection signal having an active level as detected by the coincidence detectors, and supplying said address signal to the two-dimensional coding table.

6. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means having S number (wherein S is the maximum number among the integers satisfying $S+\log_2 S < P$ and P is a positive integer) of coincidence detectors for inputting value x of event A and S number of coincidence detectors for inputting value y of event B, said coincidence detectors outputting a coincidence detection signal having an active level when the inputted value x of the event A or the value y of the event B corresponds to the numbers within the integer range of 1 to S;

first comparing means having S number of comparators for inputting the value y of the event B, said comparators outputting a comparison result signal having an active level when the inputted value y of the event B satisfies $x+\log_2 y \leq P$ corresponding to each number within said integer range of 1 to S of x;

second comparing means having S number of comparators for inputting the value x of the event A, said comparators outputting a comparison result signal having an active level when the inputted value x of the event A satisfies $y+\log_2 x \leq P$ corresponding to each number within said integer range of 1 to S of y;

escape signal generating means comprising a plurality of logic gates for inputting said coincidence detection signal from the coincidence detectors and the comparison result signal from the first and second comparators and outputting an escape signal having said active level when neither of the coincidence detection signal and the comparison result signal corresponding thereto have said active level;

address generation means having an identification address generating circuit for generating the identification address, for associating each identification address of the value x of the event A with the inputted value y and associating each identification address of the value y of the event B with the bit of the inputted value x to output an address signal of P+1 bits;

priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases;

selection means for selecting and outputting the address signal containing the identification address corresponding to the applicable value x of the event A or the value y of the event B among the address signals outputted from the address generation means according to the coincidence detection signal having an active level as detected by the coincidence detectors, and supplying said address signal to the two-dimensional coding table; and an output stop circuit stopping supply of the output signal of the selection means to the two-dimensional coding table upon receipt of the escape signal outputted from the escape signal generating means.

7. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and Y;

coincidence detection means for inputting the values x and y of the events A and B, detecting whether said values x and y coincide with numbers in an integer range of 1 to S (wherein S is the maximum number among the integers satisfying $2^{(P-S)}-1 \geq Q-\log_2 S$ and P and Q are positive integers) and detecting whether the value y of the event B coincides with the number within an integer range of 1 to R (wherein R is the maximum number among the integers satisfying $2^{(Q-R)}-1 \geq P-\log_2 R$);

first comparing means for detecting whether the inputted value y of the event B satisfies $x+\log_2 y \leq P$ with respect to the integer range of 1 to S of the value x of the event A;

second comparing means for detecting whether the inputted value x of the event A satisfies $y+\log_2 x \leq P$ with respect to the integer range of 1 to S of the value y of the event B;

escape signal generating means for outputting an escape signal and supplying said escape signal to the two-dimensional coding table when the value x of the event A or the value y of the event B does not fall within said integer range of 1 to S as detected by the coincidence detection means, when the value y of the event B does not fall within said integer range of 1 to R, and when the value y of the event B or the value x of the event A does not satisfy $x+\log_2 y \leq P$ or $y+\log_2 x \leq P$, respectfully, as detected by the first and second comparing means;

address generation means for generating and outputting an address signal from the value x of the event A and the value y of the event B and an identification address identifying the value x of the event A when the value x of the event A falls within the integer range of 1 to S as detected by the coincidence detection means and identifying the value y of the event B when the value y of the event B falls within the integer range of 1 to R; and selection means for selecting and outputting the address signal according to the output of the address generation means and supplying said address signal to the two-dimensional coding table.

8. An address generating circuit of a two-dimensional coding table according to claim 7 further comprising priority control means for selecting and outputting to said two-dimensional coding table either the coincidence detection signal of the value x or the coincidence detection signal of the value y when the value x of the event A falls within the integer range of 1 to S and the value y of the event B falls within the integer range of 1 to S as detected by the coincidence detection means.

9. An address generating circuit of a two-dimensional coding table according to claim 8, wherein the coincidence detection means has S number of coincidence detectors for inputting the value x of the event A and R number of coincidence detectors for inputting the value y of the event B, said coincidence detectors outputting a coincidence detection signal having an active level when the inputted value x corresponds to one of the numbers within the integer range of 1 to S and when the inputted value y corresponds to one of the numbers within the integer range of 1 to R, the first comparing means having S numbers of comparators for inputting the value y of the event B, said comparators outputting a comparison result signal having said active level when the inputted value y of the event B satisfies $x+\log_2 y \leq P$ corresponding to each number within said integer range of 1 to S of X, the second comparing means having S number of comparators for inputting the value x of the event A, said comparators outputting a comparison of result signal having said active level when the inputted value x of the event A satisfies $y+\log_2 x \leq P$ corresponding to each number within said integer range of 1 to S of y, the escape signal generating means comprising a plurality of logic gates for inputting said coincidence detection signal from the coincidence detectors and the comparison result signal from the first and second comparators and outputting an escape signal having said active level when neither of the coincidence detection signal and the comparison result signal corresponding thereto have said active level, the address generation means having an identification address generating circuit for generating the identification address, associating each identification address of the value x of the event A with the inputted value y of the event B and associating each identification address of the value y of the event B with the bit of the inputted value x of the event A to output an address signal of X bits, X having a value equal to a larger of P or Q+1, the priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases, and the selection means for selecting and outputting the address signal containing the identification address corresponding to the applicable value x of the event A or the value y of the event B among the address signals outputted from the address generation means according to the coincidence detection signal having an active level as detected by the coincidence detectors.

10. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means for inputting the values x and y of the events A and B and detecting whether said values x and y coincide with numbers in an integer range of 1 to S (wherein S is the maximum number among the integers satisfying $2^{(P-S)}-1 \geq Q-\log_2 S$ and P and Q are positive integers), and detecting whether the value y of the event B coincides with the numbers within of the integer range of 1 to R (wherein R is the maximum number among the integers satisfying $2^{(Q-R)}1 \geq P-\log_2 R$);

first comparing means for detecting whether the inputted value y of the event B satisfies $x+\log_2 y \leq P$ with respect to the integer range of 1 to S of the value x of the event A;

second comparing means for detecting whether the inputted value x of the event A satisfies $y+\log_2 x \leq P$ with respect to the integer range of 1 to S of the value y of the event B;

escape signal generating means for outputting an escape signal and supplying said escape signal to the two-dimensional coding table when the value x of the event A or the value y of the event B does not fall within said integer range of 1 to S as detected by the coincidence detection means, when the value y of the event B does not fall within said integer range of 1 to R, and when the value y of the event B or the value x of the event A does not satisfy $x+\log_2 y \leq P$ or $y+\log_2 x \leq P$, respectfully, as detected by the first and second comparing means;

address generation means for generating and outputting an address signal from the value x of the event A and the value y of the event B and an identification address identifying the value x of the event A when the value x of the event A falls within the integer range of 1 to S as detected by the coincidence detection means and identifying the value y of the event B when the value y of the event B falls within the integer range of 1 to R;

selection means for selecting and outputting the address signal according to the output of the address generation means and supplying said address signal to the two-dimensional coding table;

priority control means for selecting and outputting to said two-dimensional coding table either the coincidence detection signal of the value x or the coincidence detection signal of the value y when the value x of the event A falls within the integer range of 1 to S and the value y of the event B falls within the integer range of 1 to S as detected by the coincidence detection means; and an output stop circuit stopping supply of the output signal of the selection means to the two-dimensional coding table upon receipt of the escape signal outputted from the escape signal generating means.

11. An address generating circuit of a two-dimensional coding table comprising:

a two-dimensional coding table having respective coded words corresponding to a combination of x and y where the value of event A is determined as x and the value of event B as y (wherein x and y are positive integers) between two events A and B and storing the coded words in an address corresponding to each combination of x and y;

coincidence detection means having S number (wherein S is the maximum number among the integers satisfying $2^{(P-S)}-1 \geq Q-\log_2 S$ and P and Q are positive integers) of coincidence detectors for inputting value x of event A and R number (wherein R is the maximum number among the integers satisfying $2^{(Q-R)}-1 \geq P-\log_2 R$) of coincidence detectors for inputting value y of event B, said coincidence detectors outputting a coincidence detection signal having an active level when the inputted value x corresponds to one of the numbers within the integer range of 1 to S and when the inputted value y corresponds to one of the numbers within the integer range of 1 to R;

first comparing means having S number of comparators for inputting the value y of the event B, said comparators outputting a comparison result signal having an active level when the inputted value y of the event B satisfies $x+\log_2 y \leq P$ corresponding to each number within said integer range of 1 to S of x;

second comparing means having S number of comparators for inputting the value x of the event A, said comparators outputting a comparison result signal having an active level when the inputted value x of the event A satisfies $y+\log_2 x \leq P$ corresponding to each number within said integer range of 1 to S of y;

escape signal generating means comprising a plurality of logic gates for inputting said coincidence detection signal from the coincidence detectors and the comparison result signal from the first and second comparators and outputting an escape signal having said active level when neither of the coincidence detection signal and the comparison result signal corresponding thereto have said active level;

address generation means having an identification address generating circuit for generating the identification address, associating each identification address of the value x of the event A with the inputted value y and associating each identification address of the value y of the event B with the bit of the inputted value x of the event A to output an address signal of X bits, X having a value equal to a larger of P or Q+1;

priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases; and selection means for selecting and outputting the address signal containing the identification address corresponding to the applicable value x of the event A or the value y of the event B among the address signals outputted from the address generation means according to the coincidence detection signal having an active level as detected by the coincidence detectors.

12. An address generating circuit of two-dimensional coding table comprising:

a two-dimensional coding table having selective coded words corresponding to a combination of x and y where the value of event A is determined as x and the value of event as y (wherein x and y are positive integers) between two events A and B and storing the coded words in an address corresponding to each combination of x and y;

coincidence detection means having S number (wherein S is the maximum number among the integers satisfying $2^{(P-S)}-1 \geq \log_2 S$ and P and Q are positive integers) of coincidence detectors for inputting value x of event A and R number (wherein R is the maximum number among the integers satisfying $2^{(Q-R)}-1 \geq P-\log_2 R$) of coincidence detectors for inputting value y of event B, said coincidence detectors outputting a coincidence detection signal having an active level when the inputted value x corresponds to one of the numbers within the integer range 1 to S and when the inputted value y corresponds to one of the numbers within the integer range 1 to R;

first comparing means having S number of comparators for inputting the value y of the event B, said comparators outputting a comparison result signal having an active level within the inputted value y of the event B satisfies $x+\log_2 y \leq P$ corresponding to each number within said integer range of 1 to S of x;

second comparing means having S number of comparators for inputting the value x of the event A, said comparators outputting a comparison result signal having an active level when the inputted value x of the event A satisfies $y+\log_2 x \leq P$ corresponding to each number within said integer range of 1 to S of y;

escape signal generating means comprising a plurality of logic gates for inputting said coincidence detection signal from the coincidence detectors and the comparison result signal from the first and second comparators and outputting an escape signal having said active level when neither of the coincidence detection signal and the comparison result signal corresponding thereto have said active level;

address generation means having an identification address generating circuit for generating the identification address, for associating each identification address of the value x of the event A with the inputted value y and associating each identification address of the value y of the event B with the bit of the inputted value x of the event A to output an address signal of X bits, X having a value equal to a larger of P or Q+1;

priority control means comprising a plurality of logic gates for inputting the coincidence detection signal from the coincidence detectors, outputting the coincidence detection signal of the value x with precedence when both the coincidence detection signal of the value x of the event A and the coincidence detection signal of the value y of the event B have said active level and outputting both the coincidence detection signal of the value x and the coincidence detection signal of the value y in other cases;

selection means for selecting and outputting the address signal containing the identification address corresponding to the applicable value x of the event A or the value y of the event B among the address signals outputted from the address generation means according to the coincidence detection signal having an active level as detected by the coincidence detectors; and an output stop circuit stopping supply of the output signal of the selection means to the two-dimensional coding table upon receipt of the escape signal outputted from the escape signal generating means.

\* \* \* \* \*